(12) United States Patent
Hsu et al.

(10) Patent No.: US 11,747,735 B2
(45) Date of Patent: Sep. 5, 2023

(54) EUV VESSEL PERIMETER FLOW AUTO ADJUSTMENT

(71) Applicant: TAIWAN SEMICONDUCTOR MANUFACTURING COMPANY, LTD., Hsinchu (TW)

(72) Inventors: Che-Chang Hsu, Taichung (TW); Sheng-Kang Yu, Hsinchu (TW); Shang-Chieh Chien, New Taipei (TW); Li-Jui Chen, Hsinchu (TW); Heng-Hsin Liu, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/462,695

(22) Filed: Aug. 31, 2021

(65) Prior Publication Data
US 2023/0061242 A1    Mar. 2, 2023

(51) Int. Cl.
| H05G 2/00 | (2006.01) |
| G03F 7/20 | (2006.01) |
| G03F 7/00 | (2006.01) |
| G21K 1/06 | (2006.01) |
| G06T 7/00 | (2017.01) |
| G06T 1/00 | (2006.01) |

(52) U.S. Cl.
CPC ........ *G03F 7/70033* (2013.01); *G06T 1/0014* (2013.01); *G06T 7/0004* (2013.01); *G21K 1/06* (2013.01); *H05G 2/005* (2013.01); *H05G 2/006* (2013.01); *H05G 2/008* (2013.01); *G06T 2207/30148* (2013.01)

(58) Field of Classification Search
CPC ............. G03F 7/70033; G03F 7/70166; G03F 7/70858; G03F 7/70916; G03F 7/70933
See application file for complete search history.

(56) References Cited

U.S. PATENT DOCUMENTS

| 8,796,666 | B1 | 8/2014 | Huang et al. | |
| 9,093,530 | B2 | 7/2015 | Huang et al. | |
| 9,184,054 | B1 | 11/2015 | Huang et al. | |
| 9,256,123 | B2 | 2/2016 | Shih et al. | |
| 9,529,268 | B2 | 12/2016 | Chang et al. | |
| 9,548,303 | B2 | 1/2017 | Lee et al. | |
| 9,618,837 | B2 | 4/2017 | Lu et al. | |
| 9,869,928 | B2 | 1/2018 | Huang et al. | |
| 9,869,934 | B2 | 1/2018 | Huang et al. | |
| 9,869,939 | B2 | 1/2018 | Yu et al. | |
| 2006/0097203 | A1* | 5/2006 | Bykanov | G03F 7/70925 250/504 R |
| 2018/0224748 | A1* | 8/2018 | Nagai | G21K 1/06 |

* cited by examiner

*Primary Examiner* — Mesfin T Asfaw
(74) *Attorney, Agent, or Firm* — McDermott Will & Emery LLP

(57) ABSTRACT

In a method of generating extreme ultraviolet (EUV) radiation in a semiconductor manufacturing system one or more streams of a gas is directed, through one or more gas outlets mounted over a rim of a collector mirror of an EUV radiation source, to generate a flow of the gas over a surface of the collector mirror. The one or more flow rates of the one or more streams of the gas are adjusted to reduce an amount of metal debris deposited on the surface of the collector mirror.

20 Claims, 11 Drawing Sheets

EUV VESSEL PERIMETER FLOW AUTO ADJUSTMENT

BACKGROUND

Decreasing component size in semiconductor manufacturing requires further improvements in resolution of lithography systems which are achievable using extreme ultraviolet lithography (EUVL). EUVL employs radiation having a wavelength of about 1-100 nm. One method for producing EUV radiation is laser-produced plasma (LPP). In an LPP-based EUV source, a high-power laser beam is focused on small droplet targets of metal, such as tin, to form a highly ionized plasma that generates EUV radiation with a peak maximum emission at 13.5 nm.

A portion of the tin plasma may be deposited as tin debris on the collector mirror of an EUV radiation source. The deposited tin debris on the collector mirror may reduce the efficiency of the EUV source and may reduce the intensity of the generated EUV radiation. It is desirable to determine when the deposited tin debris exceeds a threshold and when the EUV radiation source requires cleaning. Also, it is desirable to reduce the deposited tin debris on the collector mirror.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
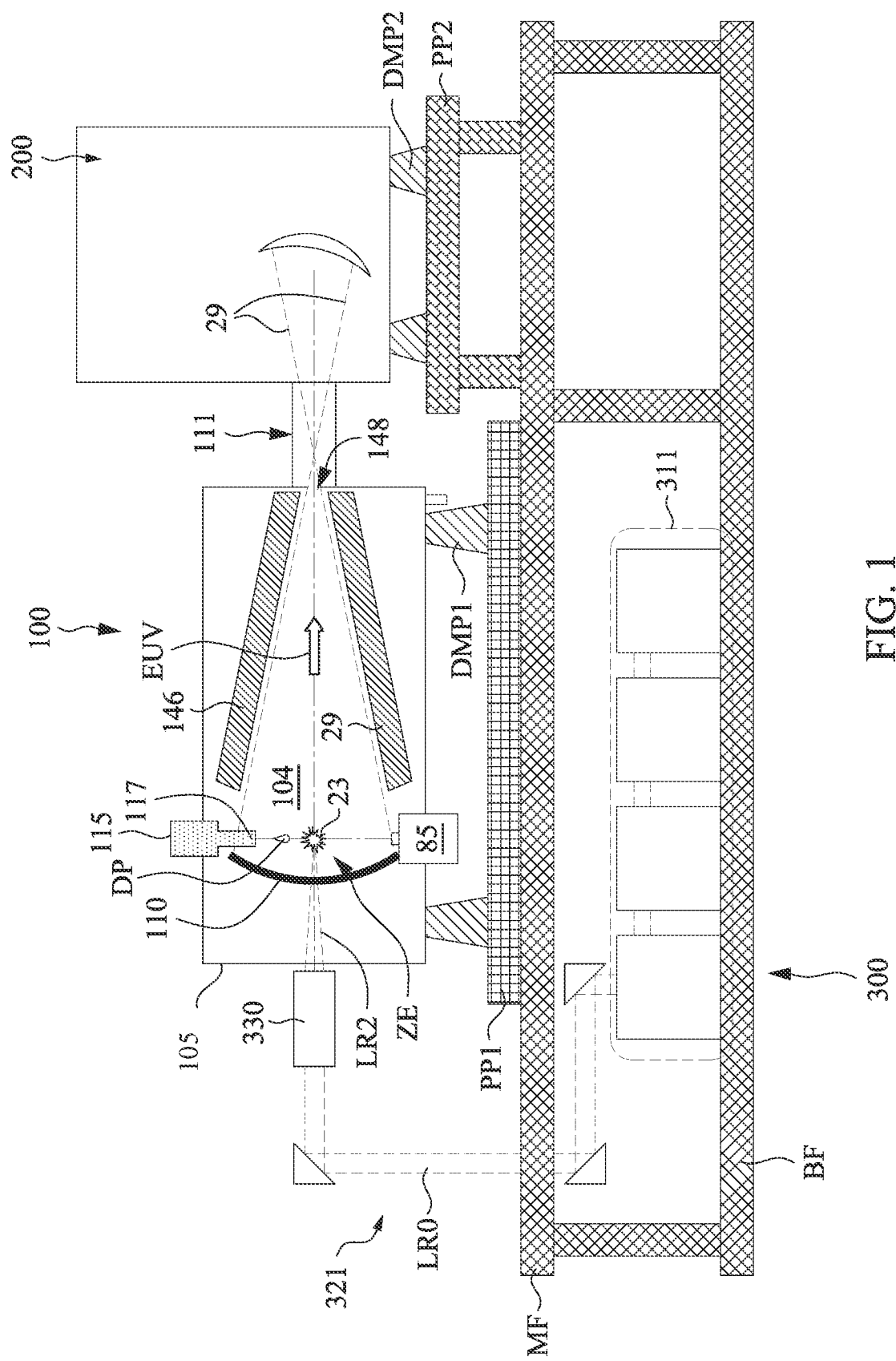
FIG. 1 is a schematic view of an EUV lithography system for semiconductor manufacturing with a laser produced plasma (LPP) EUV radiation source.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, the EUV radiation in the EUV radiation source of an extreme ultraviolet lithography (EUVL) system is produced by directing a focused laser beam, from an excitation laser source, at metal droplets to produce highly ionized metal plasma that generates EUV radiation. The metal plasma, when cooled, is deposited inside an inner chamber of the EUV radiation source and, thus, may be deposited on the collector mirror of the inner chamber of the EUV radiation source, and produces metal residues. The collector mirror, also referred to as an LPP collector mirror or an EUV collector mirror, is an important component of the LPP EUV radiation source. In some embodiments, the inner chamber of the EUV radiation source has a cone shape and the collector mirror collects and reflects, e.g., directs, the EUV radiation to exit the inner chamber of the EUV radiation source through an opening that is produced at a vertex of the cone shape. In some embodiments, the deposited metal residue on the collector mirror reduces the intensity of the generated EUV radiation and contributes to a reduction of overall EUV conversion efficiency. In particular, tin (Sn) residues, e.g., tin debris, are one of the contamination sources of the EUV radiation source and the collector mirror. Monitoring an amount of the debris deposited inside the inner chamber of the EUV radiation source and on the collector mirror is important to determine when to clean the EUV radiation source.

In some embodiments, the EUV radiation or a portion of the EUV radiation generated inside the EUV inner chamber is directed to a light detector and an intensity of the generated EUV radiation is detected. In some embodiments, the intensity of the generated EUV radiation is periodically measured/monitored, e.g., once every 1 to 10 lithography operations, and a trend of the intensity of the EUV radiation generated by the EUV radiation source is determined. As noted, the deposited metal debris, e.g., tin debris, on the collector mirror may reduce the overall EUV conversion efficiency of the EUV radiation source and, thus, the trend of the intensity of the EUV radiation may be negative and the efficiency of the EUV radiation source may be reduced after each lithography operation.

In some embodiments, gas outlets are mounted over a rim of the collector mirror. Streams of a gas are directed through the gas outlet to generate a flow of the gas over a surface of the collector mirror. In some embodiments, the streams of gas, e.g., hydrogen gas, over the surface of the collector mirror prevents, e.g., reduces, the deposition of the metal debris on the surface of the collector mirror and reduces the decreasing trend of the intensity of the EUV radiation generated by the EUV radiation source. As noted, in some embodiments, the decreasing trend of the intensity of the EUV radiation is monitored. In some embodiments, the gas outlets are turned up or down in a first direction perpendicular to a radius of the collector mirror to change the flow direction of the gas out of the gas outlets to adjust the flow rate and/or flow direction of the gas over the surface of the collector mirror to reduce the deposition of the metal debris on the surface of the collector mirror. In some embodiments, the gas outlets include one or more blades and the blades are turned right or left in a second direction crossing (e.g., perpendicular to) the first direction to further change the flow direction of the gas out of the gas outlets to further adjust the flow rate and/or flow direction of the gas over the surface of the collector mirror to reduce the deposition of the metal debris in one or more regions on the surface of the collector mirror.

In some embodiments, the gas outlets are connected by gas pipes to a gas control system. The gas control system changes the flow rate of the gas outlets by changing the flow rate of the gas in the gas pipes in some embodiments. In some embodiments, the gas outlets include a motor coupled to one or more blades, and the gas control system is coupled to and controls the motors of the gas outlets. The gas control system commands the motors of the gas outlets to turn the gas outlets up or down and/or turn the blades of the gas outlets left or right and/or other directions to change the flow direction of the gas out of the gas outlets.

FIG. 1 is a schematic view of an EUV lithography system for semiconductor manufacturing with a laser produced plasma (LPP) EUV radiation source. FIG. 1 shows a schematic view of an EUV lithography system with a laser produced plasma (LPP) EUV radiation source. The EUV lithography system includes an EUV radiation source 100 (an EUV light source) to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DMP1 and DMP2, respectively. The EUV radiation source 100 and the exposure device 200 are coupled to each other by a coupling mechanism, which may include a focusing unit 111. In some embodiments, a lithography system includes the EUV radiation source 100 and the exposure device 200.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 50 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation. Various components including those described above are integrated together and are operable to perform lithography exposing processes. The lithography system may further include other modules or be integrated with (or be coupled with) other modules.

As shown in FIG. 1, the EUV radiation source 100 includes a droplet generator 115 and a LPP collector mirror 110, enclosed by a chamber 105. FIG. 1 further shows an inner chamber 104 having a cone shape. The droplet generator 115 generates a plurality of target droplets DP, which are supplied into the inner chamber 104 through a nozzle 117. In some embodiments, the target droplets DP are tin (Sn), lithium (Li), or an alloy of Sn and Li. In some embodiments, the target droplets DP each have a diameter in a range from about 10 microns ($\mu m$) to about 100 $\mu m$. For example, in an embodiment, the target droplets DP are tin droplets, each having a diameter of about 10 $\mu m$, about 25 $\mu m$, about 50 $\mu m$, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE (e.g., a target droplet location) at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser beam LR2 generated by the excitation laser source 300 is a pulsed beam. The laser pulses of laser beam LR2 are generated by the excitation laser source 300. The excitation laser source 300 may include a laser generator 311, laser guide optics 321 and a focusing apparatus 330. In some embodiments, the laser generator 311 includes a carbon dioxide ($CO_2$) or a neodymium-doped yttrium aluminum garnet (Nd:YAG) laser source with a wavelength in the infrared region of the electromagnetic spectrum. For example, the laser source 300 has a wavelength of 9.4 $\mu m$ or 10.6 $\mu m$ in an embodiment. The laser light beam LR0 generated by the excitation laser source 300 is guided by the laser guide optics 321 and focused, by the focusing apparatus 330, into the excitation laser beam LR2 that is introduced into the EUV radiation source 100. In some embodiments, in addition to $CO_2$ and Nd:YAG lasers, the laser beam LR2 is generated by a gas laser including an excimer gas discharge laser, helium-neon laser, nitrogen laser, transversely excited atmospheric (TEA) laser, argon ion laser, copper vapor laser, KrF laser or ArF laser; or a solid state laser including Nd:glass laser, ytterbium-doped glasses or ceramics laser, or ruby laser. In some embodiments, a non-ionizing laser beam LR1 (not shown) is also generated by the excitation laser source 300 and the laser beam LR1 is also focused by the focusing apparatus 330 to pre-heat a given target droplet by generating a pre-heat laser pulse.

In some embodiments, the excitation laser beam LR2 includes the pre-heat laser pulse and a main laser pulse. In such embodiments, the pre-heat laser pulse (interchangeably referred to herein as the "pre-pulse) is used to heat (or pre-heat) the given target droplet to create a low-density target plume with multiple smaller droplets, which is subsequently heated (or reheated) by the main laser pulse from the main laser, to generate increased emission of EUV light compared to when the pre-heat laser pulse is not used.

In various embodiments, the pre-heat laser pulses have a spot size about 100 µm or less, and the main laser pulses have a spot size in a range of about 150 µm to about 300 µm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser beam LR2 is matched with the ejection-frequency of the target droplets DP in an embodiment.

The laser beam LR2 is directed through windows (or lenses) into the zone of excitation ZE. The windows adopt a suitable material substantially transparent to the laser beams LR2. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma plume 23 is generated. The plasma plume 23 emits EUV radiation 29, which is collected by the collector mirror 110. The collector mirror 110, an EUV collector mirror, further reflects and focuses the EUV radiation 29 for the lithography exposing processes performed through the exposure device 200. A droplet DP that does not interact with the laser pulses is captured by the droplet catcher 85. As shown in FIG. 1, the EUV radiation 29 is focused by the collector mirror 110 and passes through the opening 148 and focuses at the focusing unit 111 between EUV radiation source 100 and the exposure device 200. The EUV radiation 29 that enters from the focusing unit 111 into the exposure device 200 is consistent with EUV radiation that is originated from the focused point, e.g., a point source, in the focusing unit 111.

One method of synchronizing the generation of a pulse (either or both of the pre-pulse and the main pulse) from the excitation laser with the arrival of the target droplet in the zone of excitation is to detect the passage of a target droplet at given position and use it as a signal for triggering an excitation pulse (or pre-pulse). In this method, if, for example, the time of passage of the target droplet is denoted by $t_o$, the time at which EUV radiation is generated (and detected) is denoted by $t_{rad}$, and the distance between the position at which the passage of the target droplet is detected and a center of the zone of excitation is d, the speed of the target droplet, $v_{dp}$, is calculated as $$v_{dp}=d/(t_{rad}-t_o)$$ equation (1).

Because the droplet generator 115 is expected to reproducibly supply droplets at a fixed speed, once $v_{dp}$ is calculated, the excitation pulse is triggered with a time delay of $d/v_{dp}$ after a target droplet is detected to have passed the given position to ensure that the excitation pulse arrives at the same time as the target droplet reaches the center of the zone of excitation. In some embodiments, because the passage of the target droplet is used to trigger the pre-pulse, the main pulse is triggered following a fixed delay after the pre-pulse. In some embodiments, the value of target droplet speed $v_{dp}$ is periodically recalculated by periodically measuring $t_{rad}$, if needed, and the generation of pulses with the arrival of the target droplets is resynchronized. In some embodiments, the evaporated portion of the droplet DP and the generated plasma is deposited on the collector mirror 110 and on the inside surface of walls 146 of the EUV radiation source 100 and produces deposited debris.

Figure 2:
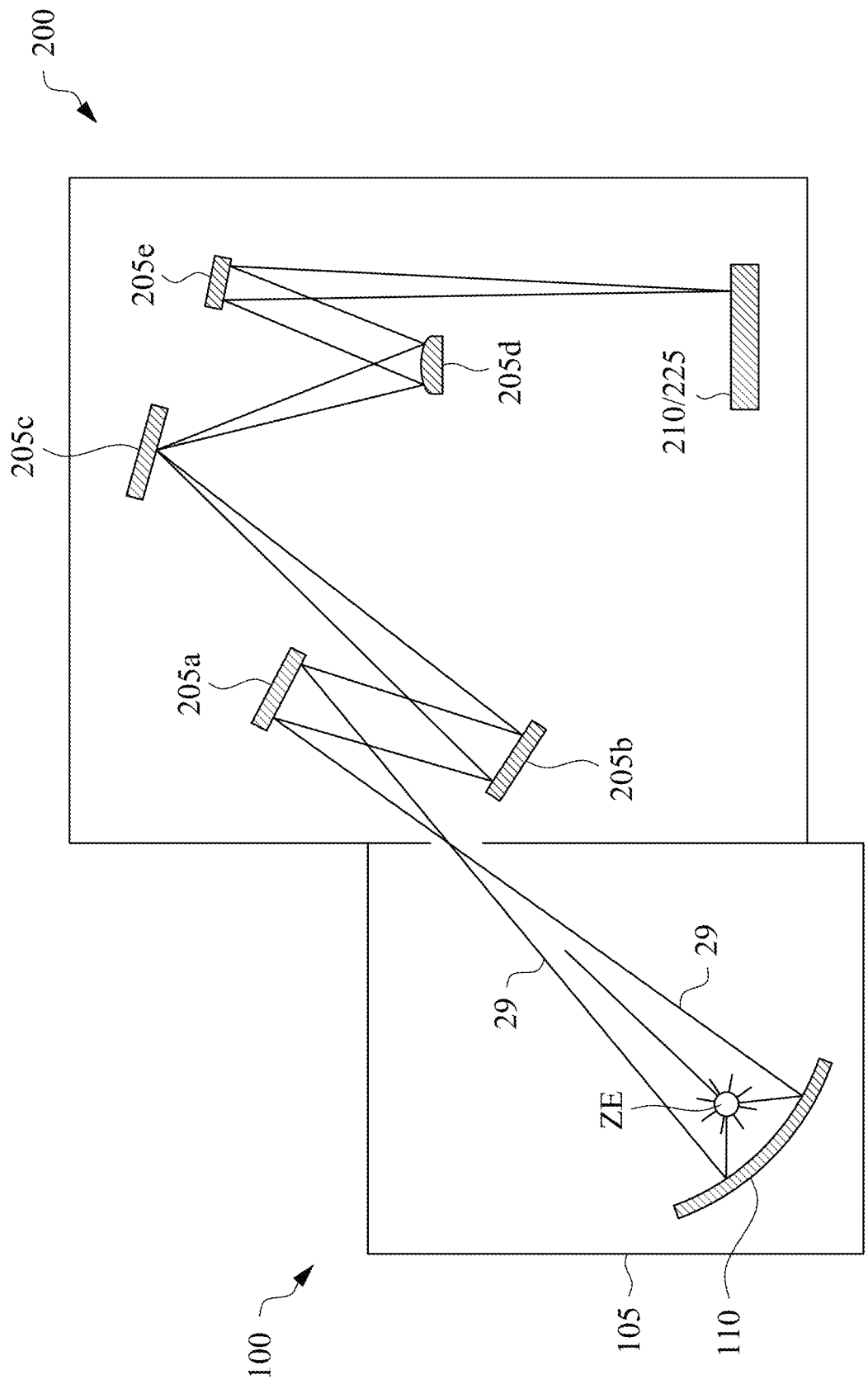
FIG. 2 shows a schematic view of an EUV lithography exposure tool/device in accordance with some embodiments of the present disclosure.

FIG. 2 shows a schematic view of an EUV lithography exposure tool/device in accordance with some embodiments of the present disclosure. The EUVL exposure tool of FIG. 2 shows the exposure device 200 that includes the exposure of photoresist coated substrate, a target semiconductor substrate 210, with a patterned beam of EUV light. In some embodiments, the exposure device 200 includes a light detector 225 and the EUV light reflected from the reticle is projected on the light detector 225. In some embodiments, the light detector 225 is an image detector and the layout pattern of the reticle is projected on the image detector and the projected layout pattern is detected. In some embodiments, the projected layout pattern on the image detector is monitored at one or more points as an indication of the EUV radiation intensity generated by the EUV radiation source 100. In some embodiments, the exposure device 200 is an integrated circuit lithography tool such as a stepper, scanner, step and scan system, direct write system, device using a contact and/or proximity mask, etc., provided with one or more optics 205a, 205b, for example, to illuminate a patterning optic, such as a reticle, e.g., a reflective mask 205c, with a beam of EUV light, to produce a patterned beam, and one or more reduction projection optics 205d, 205e, for projecting the patterned beam onto the target semiconductor substrate 210. A mechanical assembly (not shown) may be provided for generating a controlled relative movement between the target semiconductor substrate 210 and patterning optic, e.g., a reflective mask 205c. As shown, the EUVL exposure tool of FIG. 2, further includes the EUV radiation source 100 including a plasma plume 23 at the zone of excitation ZE emitting EUV light in the chamber 105 that is collected and reflected by a collector mirror 110 into the exposure device 200 to irradiate the target semiconductor substrate 210 or the light detector 225. In some embodiments, the light detector 225 monitors the intensity of the EUV radiation and when the intensity of the EUV radiation is reduced by a threshold value, e.g., a value between 10 and 20 percent, the light detector 225 generates a signal that collector mirror 110 needs cleaning.

Figure 3:
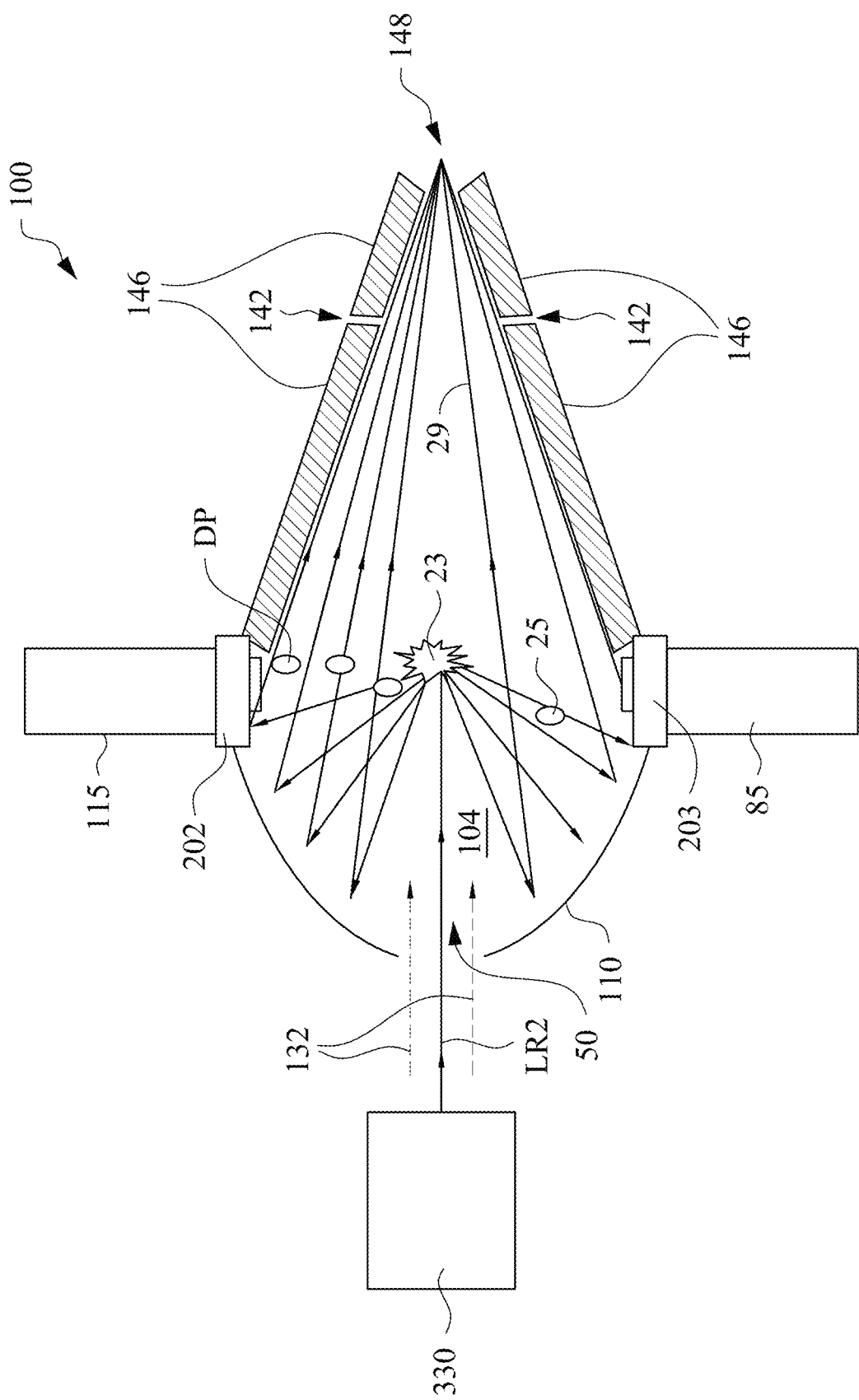
FIG. 3 shows a schematic view of portions of an EUV radiation source for semiconductor manufacturing.

FIG. 3 shows a schematic view of portions of an EUV radiation source 100 for semiconductor manufacturing. In FIG. 3, the EUV radiation source 100 includes the focusing apparatus 330, the collector mirror 110, the droplet generator 115, an aperture 50 in the collector mirror 110, and a drain such as the droplet catcher 85, e.g., a tin catcher, for receiving the unreacted tin droplets, e.g., the debris droplet 25, and tin debris. In some embodiments, the aperture 50 is used for the laser beam LR2 of the focusing apparatus 330 and gas flow 132 to enter into the EUV radiation source 100. The walls 146 are used to create the cone shape of the inner chamber 104 such that the EUV radiation 29 with a direction that stays inside the boundaries of the cone shape exits through the opening 148 and the EUV radiations having other directions do not exit the cone shape and, thus, do not exit the EUV radiation source 100. In some embodiments, the walls 146 include openings 142 and at least a portion of the gas flow 132 exits through the openings 142 in the walls 146 of the cone shape. The collector mirror 110 is made of a multi-layered mirror including Mo/Si, La/B, La/B$_4$C, Ru/B$_4$C, Mo/B$_4$C, Al$_2$O$_3$/B$_4$C, W/C, Cr/C, and Cr/Sc with a capping layer including SiO$_2$, Ru, TiO$_2$, and ZrO$_2$, in some embodiments. The diameter of the collector mirror 110 can be about 330 mm to about 750 mm depending on the chamber size of the EUV radiation source 100. The cross-sectional shape of the collector mirror 110 can be elliptical or parabolic, in some embodiments.

In some embodiments, an error exists in synchronization between the pulse frequency of the laser beam LR2 and the speed of the ejected tin droplet DP such that when the pulsed laser that is directed to the zone of excitation ZE fires, it misses some droplets and the droplets that have not reached or have already passed the zone of excitation ZE, and thus, become debris droplets 25. A portion of debris droplets 25 may be captured by droplet catcher 85 and another portion of the debris droplets 25 may deposit on the lower-half portion of the reflective surface of the collector mirror 110. The deposited debris on the collector mirror 110 may deteriorate the reflective property of the collector mirror 110, thereby lowering the power of EUV radiation source 100 for EUV photolithography. In addition, a portion of tin droplet in plasma plume 23 after passing the zone of excitation ZE may be deposited as a metal layer on the surface of the collector mirror 110 and may reduce the overall efficiency of the EUV radiation source 100. Thus, as described below with respect to FIG. 5A, the deposited metal layer on the surface of the collector mirror 110 is periodically, e.g., once every 1 to 10 lithography operations, monitored. As shown in FIG. 3, the droplet generator 115 is attached to the inner chamber 104 of the EUV radiation source 100 through an opening of an input port 202 and the droplet catcher 85 is attached to the inner chamber 104 of the EUV radiation source 100 through an opening of an input port 203. In some embodiments, as shown in FIGS. 1 and 3, the EUV radiation 29 is directed through the opening 148 to focus in the focusing unit 111 attached to the opening 148.

Figure 4:
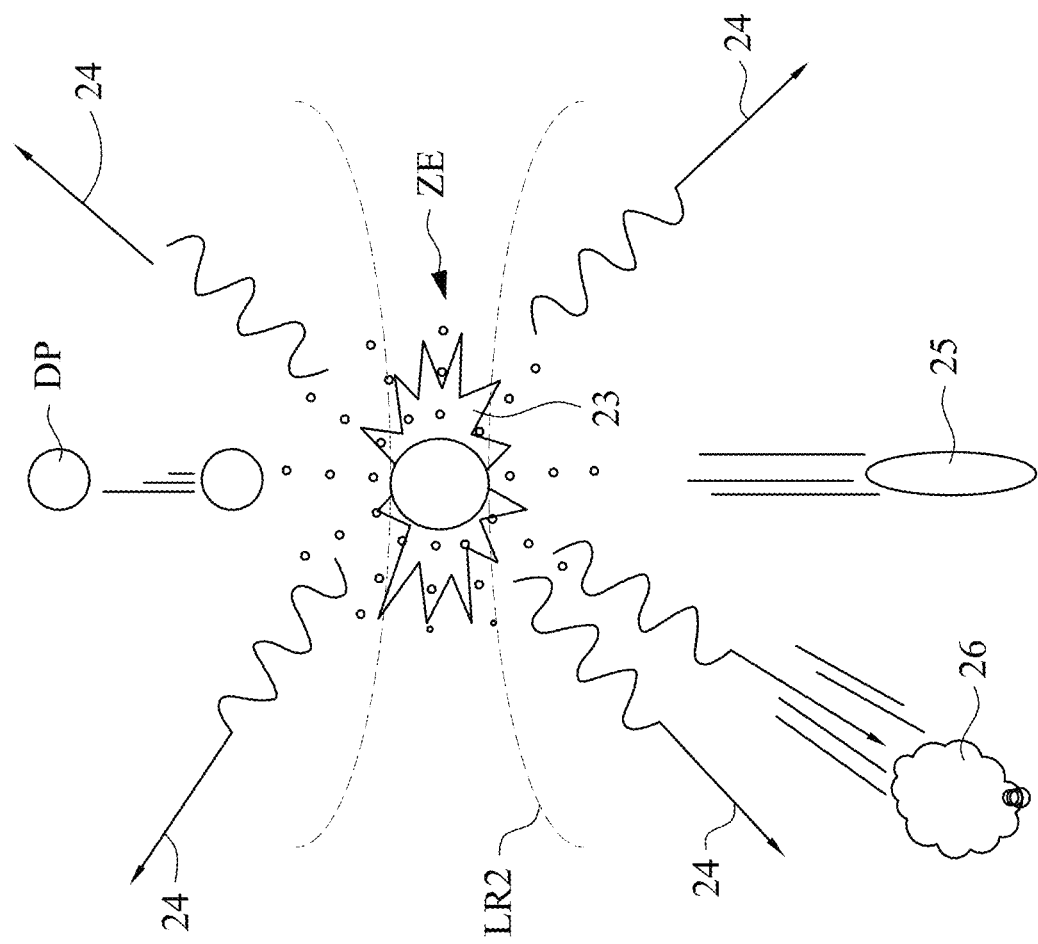
FIG. 4 shows a schematic view of plasma formation process through laser-metal interaction between a laser beam and a metal droplet.

FIG. 4 shows a schematic view of plasma formation process through laser-metal interaction between a laser beam and a metal droplet. In FIG. 4, the ejected metal droplet, e.g., the ejected tin droplet DP, reaches the zone of excitation ZE where it interacts with the laser beam LR2 to form a plasma. The zone of excitation ZE is at a focus of the high-power and high-pulse-repetition-rate pulsed laser beam LR2. The laser beam LR2 interacts with the ejected tin droplet DP at the ignition site in a space of the inner chamber 104 of the EUVL system to form the plasma plume 23 which emits EUV light rays 24 in all directions. During this laser-metal interaction, a tin droplet DP could be missed by or not interact sufficiently with the laser beam LR2, thereby passing to a position below the zone of excitation ZE in FIG. 4, forming a debris droplet 25. Also, some tin leftover from the plasma formation process can become debris 26 and may be deposited on the surface of the collector mirror 110. In some embodiments, the debris droplet 25 and the debris 26 can accumulate on the surface of the collector mirror 110 of FIG. 1, deteriorating the reflective quality of the collector mirror 110. The debris 26 and debris droplet 25 contaminate the collector mirror 110 such that the collector mirror 110 may need to cleaned and/or replaced, thereby increasing the maintenance cost, and more importantly, reducing the availability of the EUVL system. Replacing or cleaning the collector mirror 110 is time consuming, for example, replacement of the EUV collector mirror 110 may require up to 4 days. Thus, cleaning or replacing the collector mirror 110 before it is needed increases the maintenance cost and not cleaning or replacing the collector mirror 110 when the cleaning or replacement is needed deteriorates the EUV radiation. Therefore, a method of monitoring the debris on the collector mirror 110 is desirable to determine when to cleaning and/or replace the collector mirror 110 because of the contamination by the debris droplet 25 and the debris 26. In addition, a method of reducing the deposition of the tin debris on the collector mirror 110 is highly desirable.

Figure 5A:
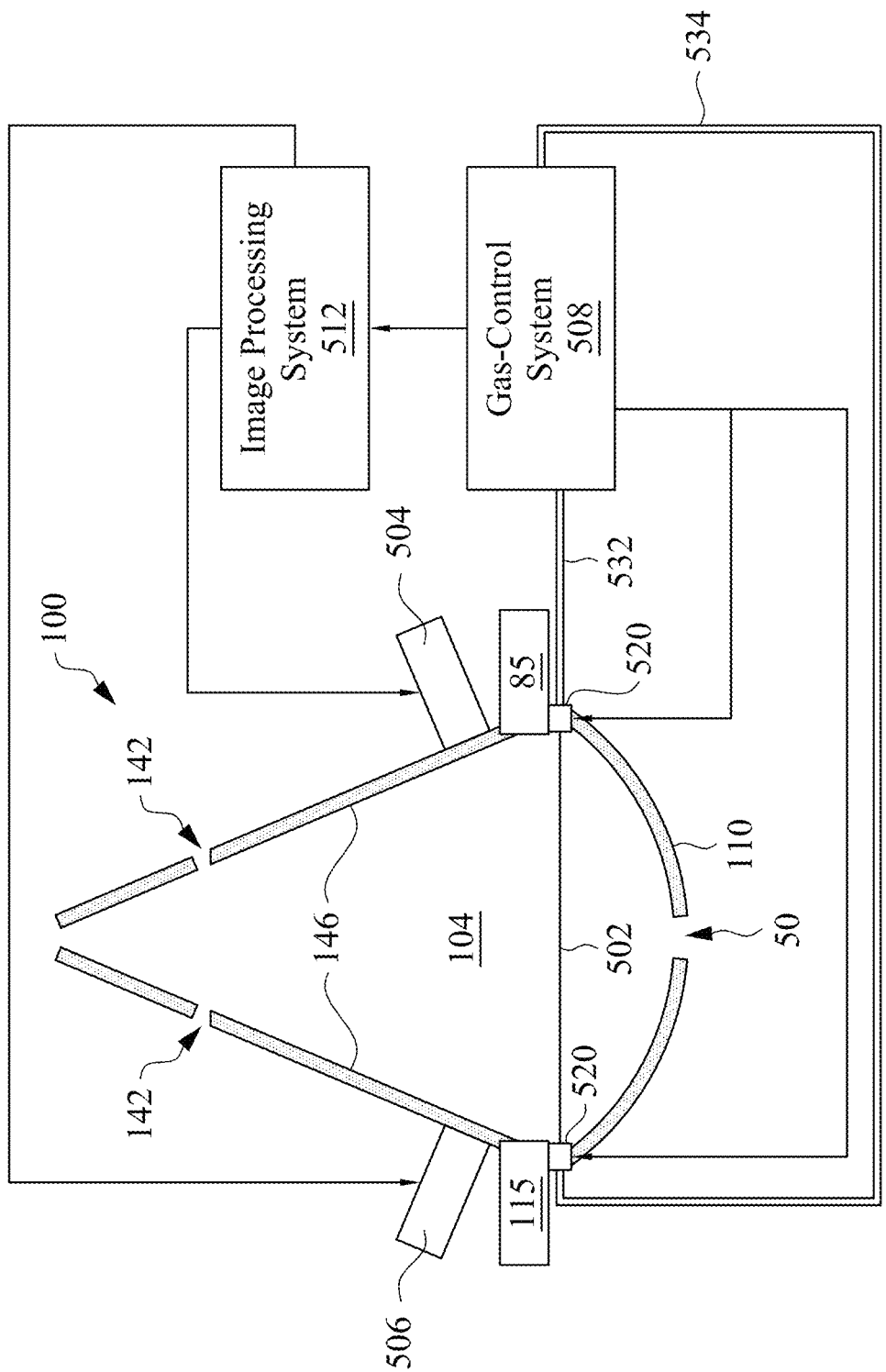
FIGS. 5A, 5B, 5C, and 5D show different views and components of an EUV radiation source in accordance with some embodiments of the present disclosure.

FIGS. 5A, 5B, 5C, and 5D show different views and components of an EUV radiation source in accordance with some embodiments of the present disclosure. FIG. 5A is consistent with FIG. 3 and includes the collector mirror 110 having a rim 502 and the aperture 50, the droplet generator 115, and the droplet catcher 85. As shown, one or more gas outlet systems 520, e.g., two gas outlet systems 520, are mounted on the rim 502 of the collector mirror 110. The gas outlet systems 520 are connected via pipes 532 and 534 to a gas-control system 508 and receives the gas from the gas-control system 508. The gas-control system 508 is coupled to and controls the gas outlet systems 520. In some embodiments, the gas-control system 508 controls the flow rate of one or more streams of the gas exiting the gas outlet systems 520 by the flow rate of the gas through the pipes 532 and 534. In addition, the gas-control system 508 controls the gas flow direction of the one or more streams of the gas exiting the gas outlet systems 520. FIG. 5A also shows an illumination module 504 and a detection module 506 connected to an image processing system 512. The illumination module 504 includes one or more light sources that produces one or more non-ionizing light beams, e.g., laser beams, to illuminate the surface of the collector mirror 110 facing the zone of excitation ZE. In some embodiments, the detection module 506 includes an image detector that acquires an image of the surface of the collector mirror 110 and sends the acquired image to the image processing system 512. In some embodiments, the image processing system 512 analyzes the acquired image and determines locations on the surface of the collector mirror 110 that is covered with the deposited metal layer, e.g., the deposited tin layer. In some embodiments, the gas-control system 508 includes a gas source or is connected to a gas source of the lithography system to provide the gas through the pipes 532 and 534. In some embodiments, each gas outlet system 520 includes a gas controller (not shown) and the gas-control system 508 controls the flow rate of each stream of the gas exiting the gas outlet system via the gas controller of the gas outlet system 520.

Figure 5B:
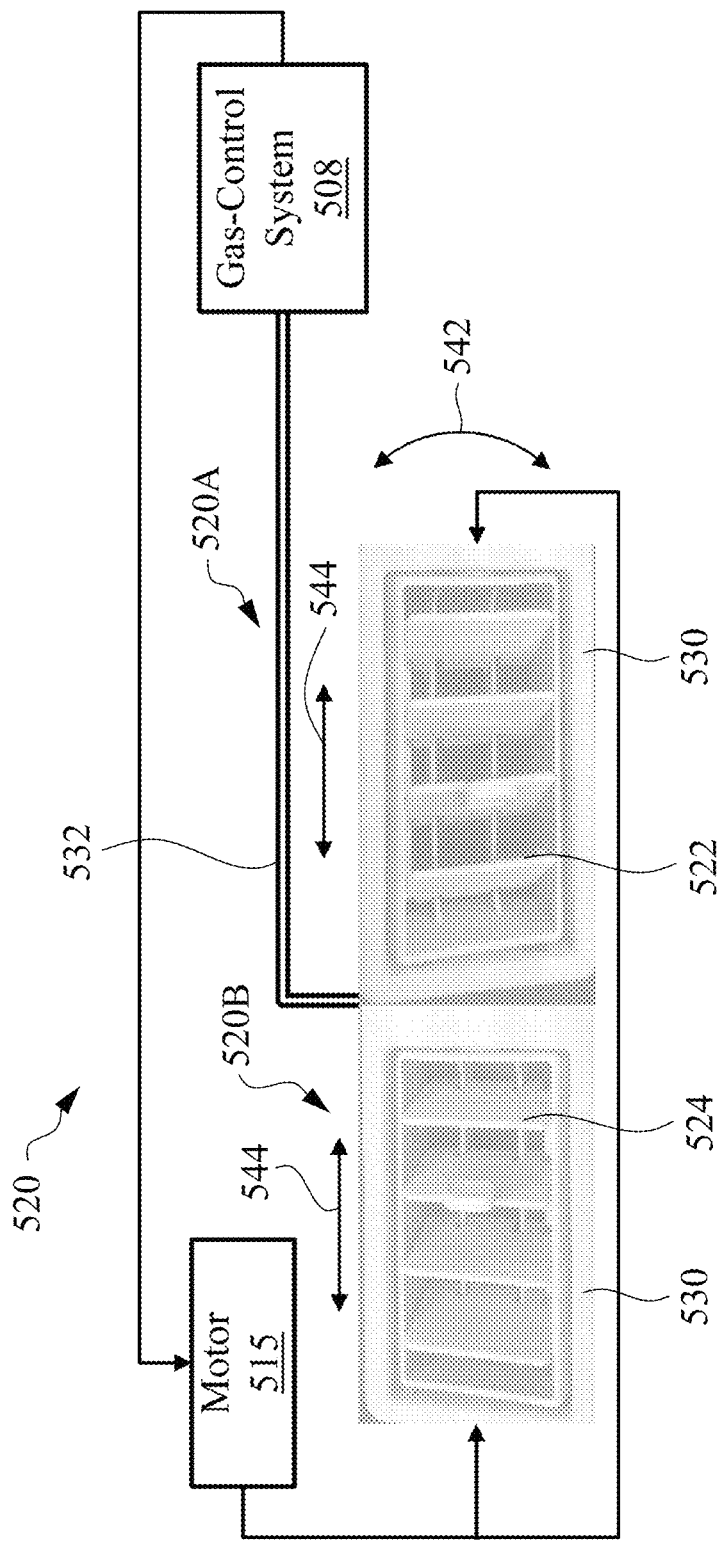

FIG. 5B shows the gas outlet system 520 that includes one or more openings, e.g., two openings 520A and 520B each having a frame 530. As shown, the gas outlet system 520 and the openings 520A and 520B are controlled by the gas-control system 508. The gas-control system 508 is connected to a motor 515 of the gas outlet system 520 and the motor 515 is configured to move blades of the two openings 520A and 520B in a first direction perpendicular to a radius of the collector mirror 110, e.g., e.g., in an up or down direction 542, to change the gas flow directions of the one or more streams of the gas exiting the gas outlet systems 520, e.g., the gas flow directions exiting the two openings 520A and 520B, in the up or down direction 542. As shown in FIG. 5B, the opening 520A includes blades 522 and the opening 520B includes blades 524. The motor 515 is configured to move the openings 520A or 520B or to move the blades 522 and 524 of the openings 520A or 520B in a second direction crossing (e.g., perpendicular to) the first direction, e.g., in a right or left direction 544 to change the gas flow directions of the one or more streams of the gas exiting the gas outlet systems 520, e.g., the gas flow directions exiting the two openings 520A and 520B, in the right or left direction 544.

Figure 5C:
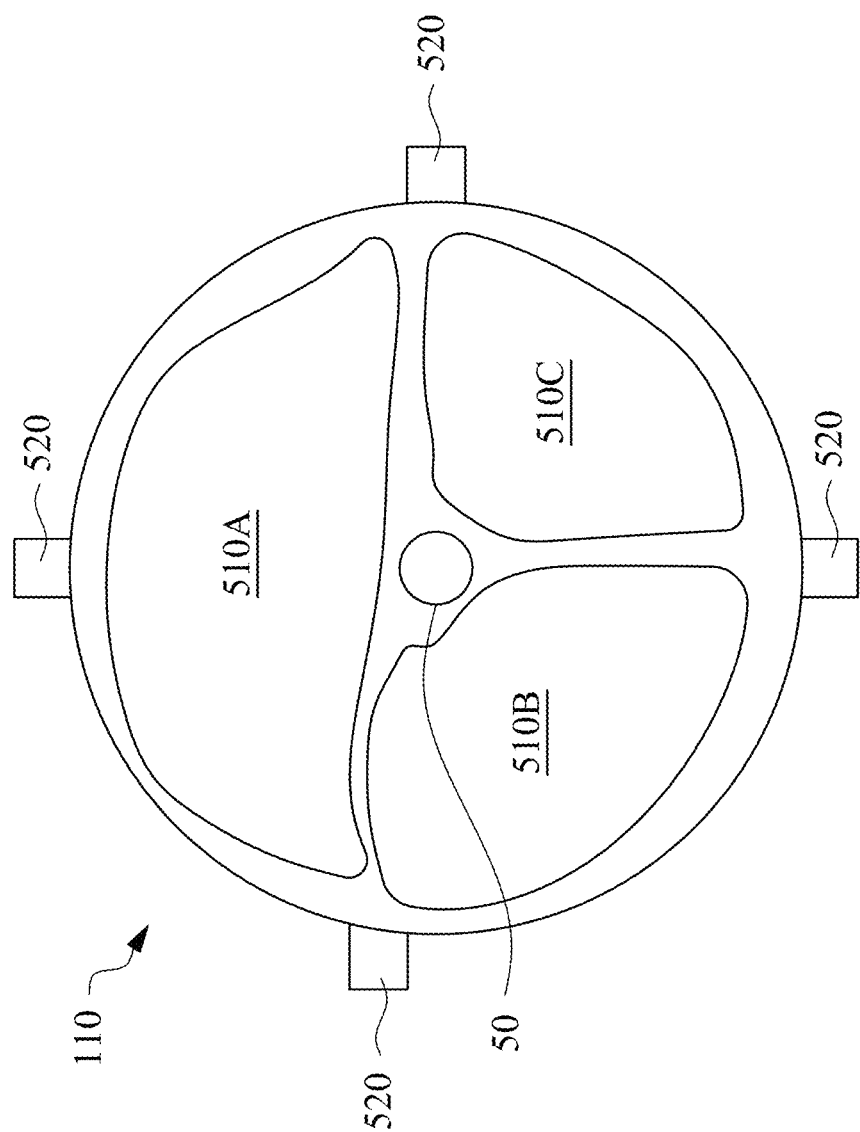

FIG. 5C shows the collector mirror 110 having the rim 502, the aperture 50, and the gas outlet systems 520 mounted on rim 502. FIG. 5C shows the surface of the collector mirror 110 having three regions 510A, 510B, and 510C. In some embodiments, the image processing system 512 analyzes the acquired image of the surface of the collector mirror 110 and determines locations on the surface of the collector mirror that is covered by deposited tin debris. In some embodiments, the image processing system 512 determines a percentage of coverage of one or more regions 510A, 510B, and 510C by the tin debris.

Figure 5D:
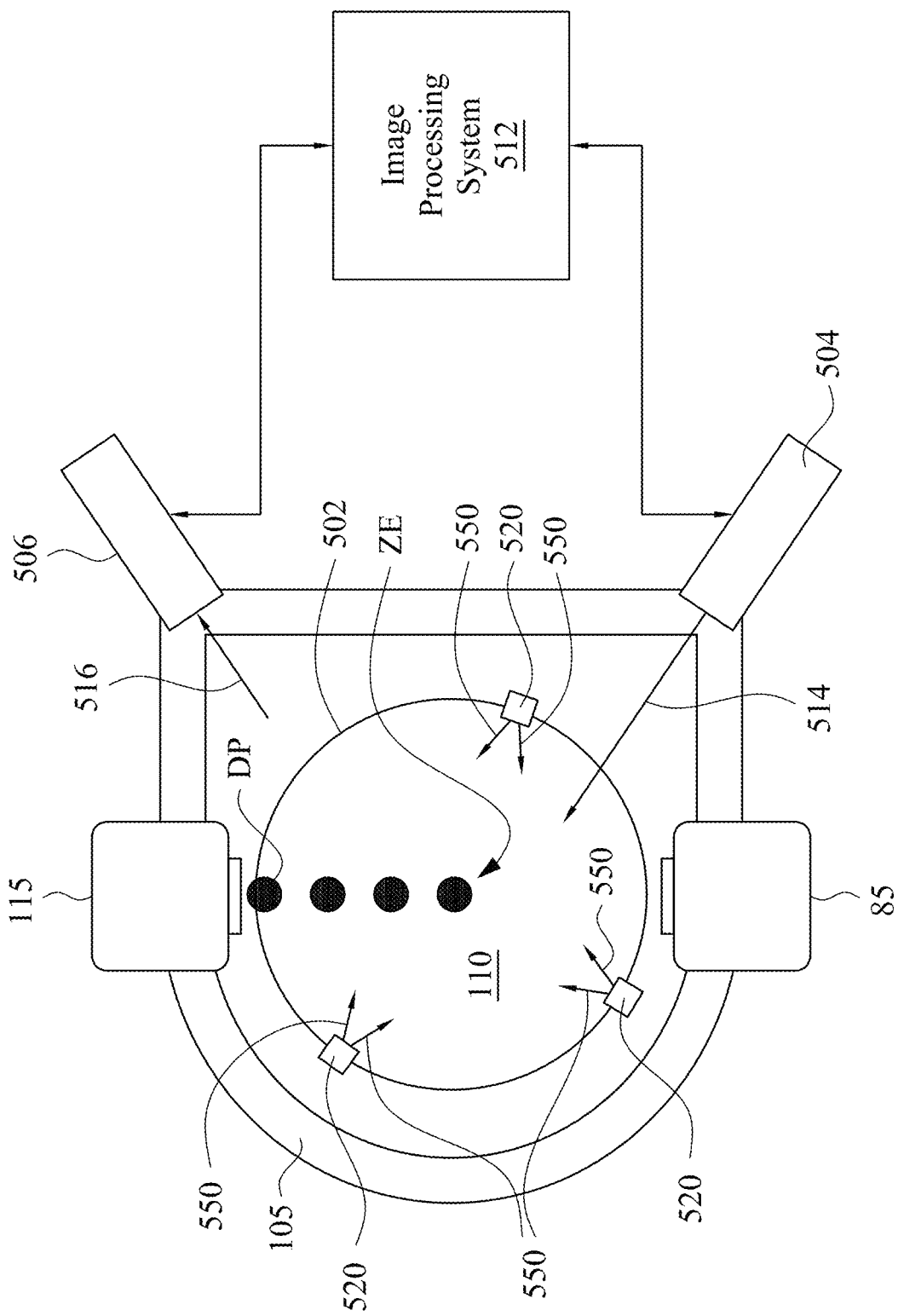

FIG. 5D shows devices for illuminating and imaging the surface of the collector mirror 110 of the EUV radiation source 100 in accordance with some embodiments of the present disclosure. A plan view 570 of FIG. 5D is a cut of the EUV radiation source 100 of FIG. 1. The plan view 570 includes the illumination module 504 and the detection module 506, the collector mirror 110, and the tin droplets DP moving from the droplet generator 115 to the zone of excitation ZE. The illumination module 504 provides a light beam 514 to illuminate the surface of the collector mirror 110 facing the zone of excitation ZE. In some embodiments, the illumination module 504 includes one or more light sources, including one or more laser sources for illuminating the surface of the collector mirror 110. In some embodiments, the illumination module 504 includes collimating optics including one or more lenses for illuminating, e.g., uniformly illuminating, the surface of the collector mirror 110. In some embodiments, the detection module 506 includes one or more image sensors, including a camera, e.g., a digital camera. In some embodiments, the detection module 506 includes condensing optics and/or imaging optics including one or more lenses for capturing a reflected light beam 516 from the surface of the collector mirror 110 to generate one or more images of the surface of the collector mirror 110. FIG. 5D also shows the streams of a gas 550 that exit the openings of the gas outlet systems 520. In some embodiments, the flow rate and the flow direction of the streams of gas 550 are adjusted such that a decreasing slope of the trend of the intensity of the EUV radiation generated by the EUV radiation source is less steep compared to a decreasing slope of the trend of the intensity of the EUV radiation when the streams of gas 550 are not implemented.

Figure 6:
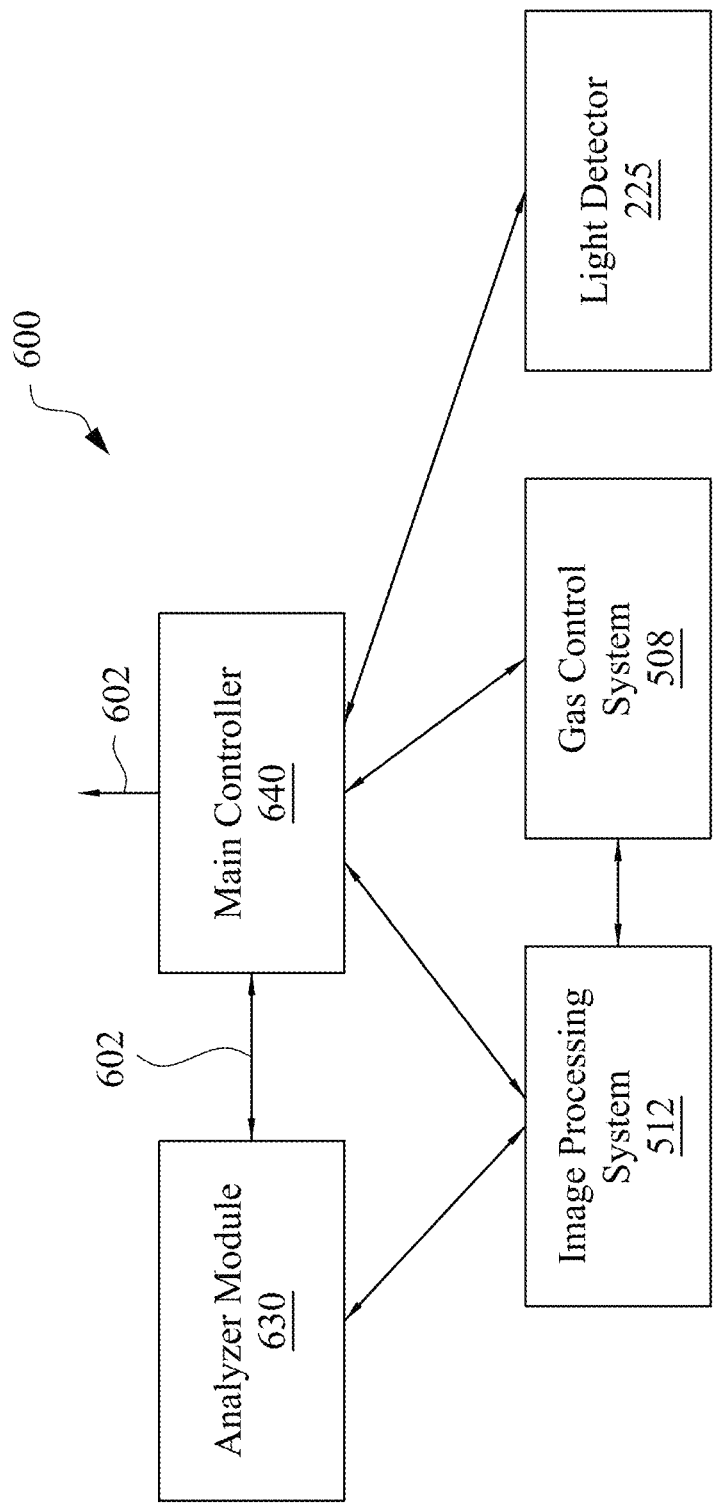
FIG. 6 shows a control system for providing a gas flow to reduce an amount of metal debris deposited on the surface of the collector mirror of an EUV radiation source for semiconductor manufacturing in accordance with some embodiments of the present disclosure.

FIG. 6 shows a control system 600 for providing a gas flow to reduce an amount of metal debris deposited on the surface of the collector mirror of an EUV radiation source for semiconductor manufacturing in accordance with some embodiments of the present disclosure. The control system 600 includes an analyzer module 630 and a main controller 640 coupled to each other. In some embodiments, the control system 600 includes the image processing system 512 of FIG. 5A or 5D, the gas-control system 508 of FIG. 5A or 5B, and the light detector 225 of FIG. 2. In some embodiments, the main controller 640 directly controls the image processing system 512, the gas-control system 508, and the light detector 225. In some embodiments, the analyzer module 630 either directly controls the image processing system 512 and the gas-control system 508, or indirectly through the main controller 640, controls the image processing system 512 and the gas-control system 508. In some embodiments, the main controller 640 commands the gas outlet systems 520 through the gas-control system 508 and adjusts the gas flow directions and the gas flow rates of the streams of gas 550 exiting the openings of the gas outlet systems 520. In some embodiments, an opening includes one or more nozzles and the nozzles are moved in the up or down direction 542 to modify, e.g., adjust, the flow direction of the streams of gas 550. In some embodiments, the nozzles are moved in the right or left direction 544. In some embodiments, the nozzles include the blades and the blades are moved in the in the right or left direction 544 to adjust the flow direction of the streams of gas 550.

In some embodiments, the image processing system 512 directly receives the captured images of the surface of the collector mirror 110 from the detection module 506. In some embodiments, the analyzer module 630 indirectly receives the captured images from the detection module 506 through the image processing system 512 and the main controller 640. In some embodiments, based on the captured images of the surface of the collector mirror 110, the analyzer modules 630 determines adjustments to the gas flow directions and the gas flow rates of the streams of gas exiting the openings of gas outlet systems 520. In some embodiments, the analyzer module 630 commands the gas outlet systems 520 through the main controller 640 and gas-control system 508 to adjust to the gas flow directions and the gas flow rates of the streams of gas 550 exiting the openings of gas outlet systems 520 to reduce an amount of deposited metal debris on the surface of the collector mirror 110. In some embodiments, the analyzer module 630 is included in the image processing system 512.

In some embodiments, the analyzer module 630 determines, based on the captured images of the collector mirror 110, whether a cleaning of the collector mirror 110 of the EUV radiation source 100 is required. The analyzer module 630 generates, e.g., sets, a signal 602 that indicates if the cleaning of the collector mirror 110 is required and sends the signal 602 to the main controller 640 and the main controller provides the signal 602 as an output signal. In some embodiments, the signal 602 is set when a threshold percentage, e.g., between 10 and 20 percent, of the surface of the collector mirror is covered by the tin debris. As described, in some embodiments, the light detector 225 monitors the intensity of the EUV radiation and when the intensity of the EUV radiation is reduced by a threshold value, the light detector 225 generates the signal 602 that collector mirror 110 to indicate the EUV radiation source 100 requires cleaning.

Figure 7:
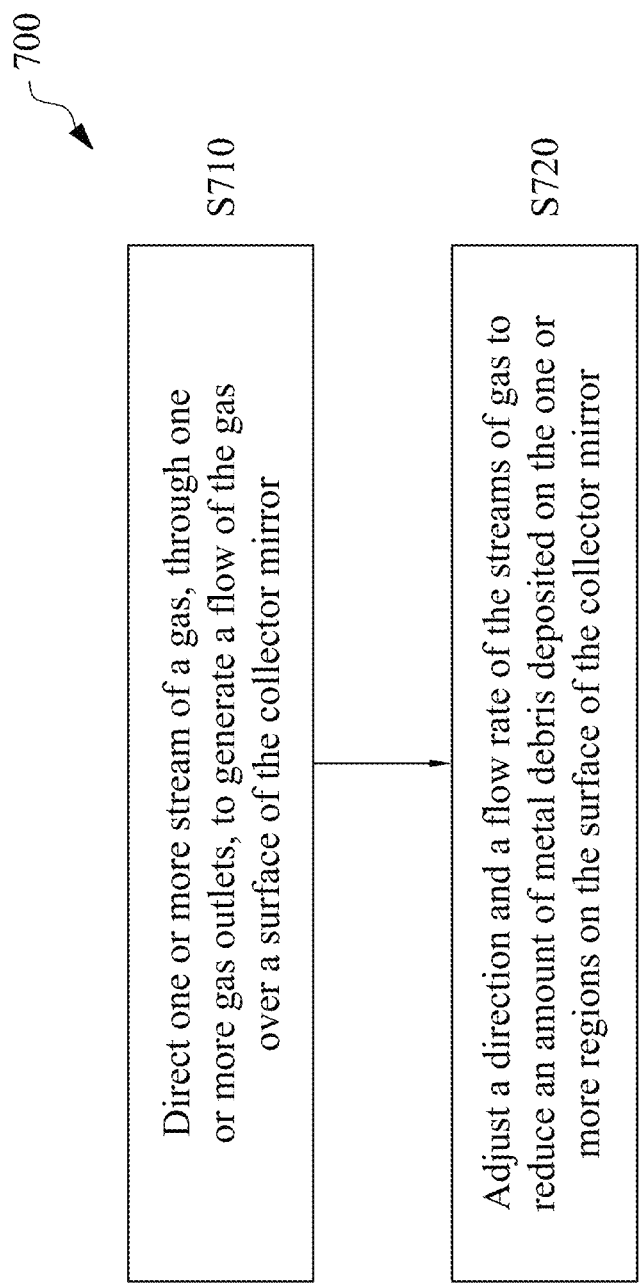
FIG. 7 shows a process of providing a gas flow to reduce an amount of metal debris deposited on the surface of the collector mirror of an EUV radiation source for semiconductor manufacturing in accordance with some embodiments of the present disclosure.

FIG. 7 shows a process 700 of providing a gas flow to reduce an amount of metal debris deposited on the surface of the collector mirror of an EUV radiation source for semiconductor manufacturing in accordance with some embodiments of the present disclosure. The process 700 or a portion of the process 700 may be performed by the control system 600 of FIG. 6. In some embodiments, the process 700 or a portion of the process 700 is performed and/or is controlled by the computer system 800 described below with respect to FIGS. 8A and 8B. The method includes an operation S710, where one or more streams of a gas is directed, through one or more gas outlets to generate a flow of the gas over a surface of the collector mirror. As shown in FIG. 5D, streams of a gas 550 are directed through the openings of the gas outlet systems 520. In operation S720, one or more flow rates of the one or more streams of the gas is adjusted to reduce an amount of metal debris deposited on the surface of the collector mirror. As shown in FIGS. 5D and 4, the flow rates of the streams of the gas 550 are adjusted to reduce an amount of metal debris 26 that is deposited on the surface of the collector mirror 110. In some embodiments, the streams of gas 550 generate a laminar flow of the gas adjacent to the surface of the collector mirror 110.

Figure 8A:
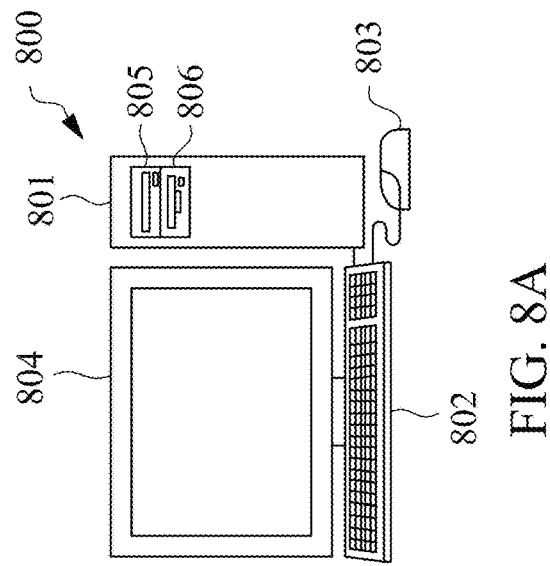
FIGS. 8A and 8B illustrate an apparatus for providing a gas flow to reduce an amount of metal debris deposited on the surface of the collector mirror of an EUV radiation source for semiconductor manufacturing in accordance with some embodiments of the present disclosure.
Figure 8B:
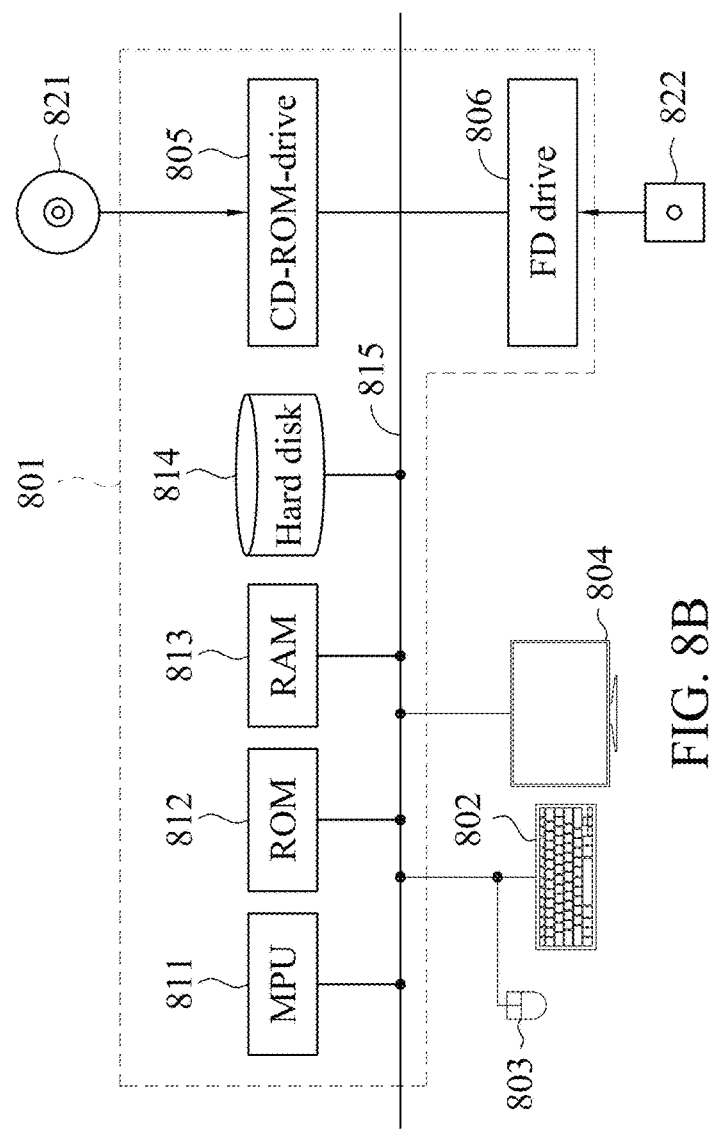

FIGS. 8A and 8B illustrate a computer system 800 for providing a gas flow to reduce an amount of metal debris deposited on the surface of the collector mirror of an EUV radiation source for semiconductor manufacturing in accordance with some embodiments of the present disclosure. In some embodiments, the computer system 800 is used for performing the functions of the modules of FIG. 6 that include the main controller 640, the analyzer module 630, the image processing system 512 and the gas-control system 508. In some embodiments, the computer system 800 is used to execute the process 700 of FIG. 7.

FIG. 8A is a schematic view of a computer system that performs the functions of an apparatus for controlling the flow of the gas over the surface of the collector mirror 110 for semiconductor manufacturing. All of or a part of the processes, method and/or operations of the foregoing embodiments can be realized using computer hardware and computer programs executed thereon. In FIG. 8A, a computer system 800 is provided with a computer 801 including an optical disk read only memory (e.g., CD-ROM or DVD-ROM) drive 805 and a magnetic disk drive 806, a keyboard 802, a mouse 803, and a monitor 804.

FIG. 8B is a diagram showing an internal configuration of the computer system 800. In FIG. 8B, the computer 801 is provided with, in addition to the optical disk drive 805 and the magnetic disk drive 806, one or more processors, such as a micro processing unit (MPU) 811, a ROM 812 in which a program such as a boot up program is stored, a random access memory (RAM) 813 that is connected to the MPU 811 and in which a command of an application program is temporarily stored and a temporary storage area is provided, a hard disk 814 in which an application program, a system program, and data are stored, and a bus 815 that connects the MPU 811, the ROM 812, and the like. Note that the computer 801 may include a network card (not shown) for providing a connection to a LAN.

The program for causing the computer system 800 to execute the functions of the control system for controlling the flow of the gas over the surface of the collector mirror 110 of the EUV radiation source 100 in the foregoing embodiments may be stored in an optical disk 821 or a magnetic disk 822, which are inserted into the optical disk drive 805 or the magnetic disk drive 806, and transmitted to the hard disk 814. Alternatively, the program may be transmitted via a network (not shown) to the computer 801 and stored in the hard disk 814. At the time of execution, the program is loaded into the RAM 813. The program may be loaded from the optical disk 821 or the magnetic disk 822, or directly from a network. The program does not necessarily have to include, for example, an operating system (OS) or a third party program to cause the computer 801 to execute the functions of the control system for controlling the flow of the gas over the surface of the collector mirror 110 in the foregoing embodiments. The program may only include a command portion to call an appropriate function (module) in a controlled mode and obtain desired results.

According to some embodiments of the present disclosure, a method of generating extreme ultraviolet (EUV) radiation in a semiconductor manufacturing system includes directing one or more streams of a gas, through one or more gas outlets mounted over a rim of a collector mirror of an EUV radiation source, to generate a flow of the gas over a surface of the collector mirror. The method further includes adjusting one or more flow rates of the one or more streams of the gas to reduce an amount of metal debris deposited on the surface of the collector mirror. In an embodiment, the method further includes acquiring an image of the surface of the collector mirror, analyzing the acquired image of the surface of the collector mirror, and determining a map of coverage of the surface of the collector mirror by the metal debris. In an embodiment, the method further includes adjusting the one or more flow rates of the one or more streams of the gas based on the determined map. In an embodiment, the method further includes generating a signal to stop operation of the EUV radiation source when a percentage coverage of the surface of the collector mirror is more than a threshold value. In an embodiment, the method further includes determining an intensity of the EUV radiation generated by the EUV radiation source, determining a decreasing trend of the intensity of the EUV radiation generated by the EUV radiation source, and adjusting the one or more flow rates of the one or more streams of the gas to reduce the decreasing trend of the intensity of the EUV radiation generated by the EUV radiation source. In an embodiment, the method further includes adjusting one or more flow directions of the one or more streams of the gas to reduce the decreasing trend of the intensity of the EUV radiation. In an embodiment, the metal debris is tin debris and the method further includes adjusting one or more flow directions of the one or more streams of the gas to reduce an amount of tin debris deposited on the surface of the collector mirror.

According to some embodiments of the present disclosure, a method of generating extreme ultraviolet (EUV) radiation in a semiconductor manufacturing system includes directing two or more streams of gas, through two or more gas outlets mounted over a rim of a collector mirror of an EUV radiation source, to generate a flow of the gas over one or more regions on a surface of the collector mirror. The method further includes adjusting two or more flow directions and two or more flow rates of the two or more streams of gas to reduce an amount of tin debris deposited on the one or more regions on the surface of the collector mirror. In an embodiment, the method further includes irradiating the surface of the collector mirror of the EUV radiation source with a non-ionizing light, detecting reflected light from the surface of the collector mirror, acquiring an image of the surface of the collector mirror, analyzing the acquired image of the surface of the collector mirror, and determining a map of coverage of the surface of the collector mirror by the tin debris. In an embodiment, the method further includes adjusting the two or more flow rates and the two or more flow directions of the two or more streams of gas based on the determined map in the one or more regions on the surface of the collector mirror. In an embodiment, the method further includes focusing an excitation laser beam on a tin droplet to produce a plasma plume from the tin droplet. The plasma plume generates the EUV radiation, and a portion of the plasma plume produces the tin debris. In an embodiment, the method further includes generating a laminar flow of the gas adjacent to the surface of the collector mirror. In an embodiment, each gas outlet includes a nozzle and the method further includes directing the two or more streams of gas through two or more nozzles of the two or more gas outlets, and turning the nozzles up or down in a first direction perpendicular to a radius of the collector mirror to adjust the two or more flow directions of the two or more streams of gas. In an embodiment, each nozzle include one or more blades, and the method further includes turning the one or more blades of the two or more nozzles right or left in a second direction perpendicular to the first direction to adjust the two or more flow directions of the two or more streams of gas.

According to some embodiments of the present disclosure, a semiconductor manufacturing system includes a main controller, an analyzer module coupled to the main controller, and an extreme ultraviolet (EUV) radiation source. The EUV radiation source includes a chamber, a droplet generator to introduce tin droplets into the chamber, an excitation laser for generating an excitation laser beam to focus onto the tin droplets at a zone of excitation to generate EUV radiation, a collector mirror for directing the EUV radiation to outside the chamber, and one or more gas outlet systems. Each gas outlet system includes a gas controller and an opening that is mounted over a rim of the collector mirror. The one or more gas outlet systems generate one or more streams of a gas through the openings of the one or more gas outlet systems to generate a flow of the gas over a surface of the collector mirror. The EUV radiation source also includes an illumination module to illuminate the surface of the collector mirror, and a detection module to capture one or more images of the surface of the collector mirror. The main controller commands the illumination module to illuminate the surface of the collector mirror. The main controller also commands the detection module to capture an image of the surface of the collector mirror and to send the captured image to the analyzer module. The analyzer module determines a map of coverage of the surface of the collector mirror by tin debris. The main controller adjusts one or more flow rates and one or more flow directions of the one or more streams of the gas, via the gas controllers of the gas outlet systems, based on the determined map of the surface of the collector mirror. In an embodiment, the system further includes a light detector coupled to the main controller. The light detector detects an intensity of the EUV radiation generated by the EUV radiation source and generates a signal proportional to the intensity of the EUV radiation and send the signal to the analyzer module. Based on the signal, the analyzer module determines a decreasing trend of the intensity of the EUV radiation, and the main controller commands the gas controllers of the gas outlet systems to adjust the one or more flow rates and the one or more flow directions of the one or more streams of the gas to reduce the decreasing trend of the intensity of the EUV radiation generated by the EUV radiation source. In an embodiment, the main controller commands the gas controllers of the gas outlet systems to adjust the one or more flow rates of the one or more streams of the gas to reduce an amount of tin debris deposited on the surface of the collector mirror. In an embodiment, each gas outlet system includes a motor. The main controller commands the motors of the gas outlet systems via the gas controllers to turn the openings of the gas outlet systems up or down in a first direction perpendicular to a radius of the collector mirror to adjust the one or more flow directions of the one or more streams of the gas. In an embodiment, each opening of a gas outlet system includes one or more blades. The main controller commands the motors of the gas outlet systems, via the gas controllers, to turn the one or more blades of the opening of each gas outlet system in a second direction perpendicular to the first direction to adjust the one or more flow directions of the one or more streams of the gas. In an embodiment, the EUV radiation source includes between two to sixteen gas outlet systems. The openings of the gas outlet systems are mounted with uniform distribution over the rim of the collector mirror.

As described in the foregoing embodiments, one or more streams of a gas is directed, through one or more gas outlets, to generate a flow of the gas over a surface of the collector mirror to reduce an amount of metal debris deposited on the surface of the collector mirror of an EUV radiation source to increase the time between two cleanings of the collector mirror of the EUV radiation source.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of generating extreme ultraviolet (EUV) radiation in a semiconductor manufacturing system, comprising:
    directing one or more streams of a gas, through one or more gas outlets mounted over a rim of a collector mirror of an EUV radiation source, to generate a flow of the gas over a surface of the collector mirror;
    acquiring an image of the surface of the collector mirror;
    analyzing the acquired image of the surface of the collector mirror;
    determining a map of coverage of the surface of the collector mirror by the metal debris; and
    adjusting one or more flow rates of the one or more streams of the gas based on the determined map to reduce an amount of metal debris deposited on the surface of the collector mirror.

2. The method of claim 1, wherein the image is acquired by a camera.

3. The method of claim 1, wherein the determined map comprises an area of the collector mirror between a rim and an aperture, through which an excitation laser passes, of the collector mirror.

4. The method of claim 1, further comprising:
    generating a signal to stop operation of the EUV radiation source when a percentage coverage of the surface of the collector mirror is more than a threshold value.

5. The method of claim 1, further comprising:
    determining an intensity of the EUV radiation generated by the EUV radiation source;
    determining a decreasing trend of the intensity of the EUV radiation generated by the EUV radiation source; and
    adjusting the one or more flow rates of the one or more streams of the gas to reduce the decreasing trend of the intensity of the EUV radiation generated by the EUV radiation source.

6. The method of claim 5, further comprising:
    adjusting one or more flow directions of the one or more streams of the gas to reduce the decreasing trend of the intensity of the EUV radiation.

7. The method of claim 1, wherein the metal debris is tin debris, and wherein the method further comprises:
    adjusting one or more flow directions of the one or more streams of the gas to reduce an amount of tin debris deposited on the surface of the collector mirror.

8. A method of generating extreme ultraviolet (EUV) radiation in a semiconductor manufacturing system, comprising:
   directing two or more streams of gas, through two or more gas outlets mounted over a rim of a collector mirror of an EUV radiation source, to generate a flow of the gas over one or more regions on a surface of the collector mirror; and
   adjusting two or more flow directions and two or more flow rates of the two or more streams of gas to reduce an amount of tin debris deposited on the one or more regions on the surface of the collector mirror.

9. The method of claim 8, further comprising:
   irradiating the surface of the collector mirror of the EUV radiation source with a non-ionizing light;
   detecting reflected light from the surface of the collector mirror;
   acquiring an image of the surface of the collector mirror;
   analyzing the acquired image of the surface of the collector mirror; and
   determining a map of coverage of the surface of the collector mirror by the tin debris.

10. The method of claim 9, further comprising:
   adjusting the two or more flow rates and the two or more flow directions of the two or more streams of gas based on the determined map in the one or more regions on the surface of the collector mirror.

11. The method of claim 8, further comprising:
   focusing an excitation laser beam on a tin droplet to produce a plasma plume from the tin droplet, wherein the plasma plume generates the EUV radiation, and wherein a portion of the plasma plume produces the tin debris.

12. The method of claim 8, further comprising:
   generating a laminar flow of the gas adjacent to the surface of the collector mirror.

13. The method of claim 8, wherein each gas outlet comprises a nozzle, and wherein the method further comprises:
   directing the two or more streams of gas through two or more nozzles of the two or more gas outlets; and
   turning the nozzles up or down in a first direction perpendicular to a radius of the collector mirror to adjust the two or more flow directions of the two or more streams of gas.

14. The method of claim 13, wherein each nozzle include one or more blades, and wherein the method further comprises:
   turning the one or more blades of the two or more nozzles right or left in a second direction perpendicular to the first direction to adjust the two or more flow directions of the two or more streams of gas.

15. A semiconductor manufacturing system, comprising:
   a main controller;
   an analyzer module coupled to the main controller; and
   an extreme ultraviolet (EUV) radiation source that comprises:
      a chamber;
      a droplet generator that is configured to introduce tin droplets into the chamber;
      an excitation laser configured to generate an excitation laser beam to focus onto the tin droplets at a zone of excitation to generate EUV radiation;
      a collector mirror configured to direct the EUV radiation to outside the chamber;
      one or more gas outlet systems, wherein each gas outlet system comprises an opening mounted over a rim of the collector mirror and a gas controller, and wherein the one or more gas outlet systems are configured to generate one or more streams of a gas through the openings of the one or more gas outlet systems to generate a flow of the gas over a surface of the collector mirror;
      an illumination module configured to illuminate the surface of the collector mirror; and
      a camera configured to capture one or more images of the surface of the collector mirror,
   wherein the main controller is configured to command the illumination module to illuminate the surface of the collector mirror, wherein the main controller is configured to command the camera to capture an image of the surface of the collector mirror and to send the captured image to the analyzer module, wherein the analyzer module is configured to determine a map of coverage of the surface of the collector mirror by tin debris, and wherein the main controller is configured to adjust one or more flow rates and one or more flow directions of the one or more streams of the gas, via the gas controllers of the gas outlet systems, based on the determined map of the surface of the collector mirror.

16. The semiconductor manufacturing system of claim 15, further comprising:
   a light detector coupled to the main controller, wherein the light detector is configured to detect an intensity of the EUV radiation generated by the EUV radiation source and generate a signal proportional to the intensity of the EUV radiation and send the signal to the analyzer module, wherein, based on the signal, the analyzer module is configured to determine a decreasing trend of the intensity of the EUV radiation, and wherein the main controller is configured to command the gas controllers of the gas outlet systems to adjust the one or more flow rates and the one or more flow directions of the one or more streams of the gas to reduce the decreasing trend of the intensity of the EUV radiation generated by the EUV radiation source.

17. The semiconductor manufacturing system of claim 15, wherein the main controller is configured to command the gas controllers of the gas outlet systems to adjust the one or more flow rates of the one or more streams of the gas to reduce an amount of tin debris deposited on the surface of the collector mirror.

18. The semiconductor manufacturing system of claim 15, wherein each gas outlet system further comprises a motor, wherein the main controller is configured to command the motors of the gas outlet systems, via the gas controllers, to turn the openings of the gas outlet systems up and down in a first direction perpendicular to a radius of the collector mirror to adjust the one or more flow directions of the one or more streams of the gas.

19. The semiconductor manufacturing system of claim 18, wherein each opening of a gas outlet system comprises one or more blades, wherein the main controller is configured to command the motors of the gas outlet systems, via the gas controllers, to turn the one or more blades of the opening of each gas outlet system in a second direction perpendicular to the first direction to adjust the one or more flow directions of the one or more streams of the gas.

20. The semiconductor manufacturing system of claim 15, wherein the EUV radiation source comprises between two to sixteen gas outlet systems, wherein the openings of the gas outlet systems are mounted with uniform distribution over the rim of the collector mirror.

* * * * *